(12) United States Patent
Yan et al.

(10) Patent No.: US 11,758,787 B2
(45) Date of Patent: Sep. 12, 2023

(54) DISPLAY PANEL AND DISPLAY DEVICE WITH BALANCED BRIGHTNESS DIFFERENCE BETWEEN EDGE AND CENTER OF DISPLAY AREA

(71) Applicant: Hubei Yangtze Industrial Innovation Center Of Advanced Display Co., Ltd., Wuhan (CN)

(72) Inventors: Jun Yan, Wuhan (CN); Ai Xiao, Wuhan (CN); Jiaxian Liu, Shanghai (CN)

(73) Assignee: HUBEI YANGTZE INDUSTRIAL INNOVATION CENTER OF ADVANCED DISPLAY CO., LTD., Wuhan (CN)

( * ) Notice: Subject to any disclaimer, the term of this patent is extended or adjusted under 35 U.S.C. 154(b) by 329 days.

(21) Appl. No.: 17/130,980

(22) Filed: Dec. 22, 2020

(65) Prior Publication Data
US 2022/0140007 A1    May 5, 2022

(30) Foreign Application Priority Data

Oct. 30, 2020  (CN) .......................... 202011193480.X

(51) Int. Cl.
| | |
|---|---|
| *H10K 59/38* | (2023.01) |
| *H10K 50/844* | (2023.01) |
| *H10K 50/86* | (2023.01) |
| *H10K 59/12* | (2023.01) |

(52) U.S. Cl.
CPC .......... *H10K 59/38* (2023.02); *H10K 50/844* (2023.02); *H10K 50/865* (2023.02); *H10K 59/12* (2023.02)

(58) Field of Classification Search
None
See application file for complete search history.

(56) References Cited

U.S. PATENT DOCUMENTS

| | | | |
|---|---|---|---|
| 2013/0155537 A1* | 6/2013 | Liu ................... | G02F 1/133514 |
| | | | 359/891 |
| 2017/0097538 A1* | 4/2017 | Cho .................... | G02F 1/13394 |
| 2021/0074769 A1* | 3/2021 | Park ..................... | H01L 33/504 |
| 2021/0104586 A1* | 4/2021 | Baek ..................... | H01L 27/322 |

FOREIGN PATENT DOCUMENTS

| | | |
|---|---|---|
| CN | 104835830 A | 8/2015 |
| CN | 110911441 A | 3/2020 |

* cited by examiner

*Primary Examiner* — Nduka E Ojeh
(74) *Attorney, Agent, or Firm* — Anova Law Group, PLLC

(57) ABSTRACT

A display panel and a display device are provided. The display panel includes a display area, a substrate, an array layer located on a side of the substrate, and a light-emitting layer located on a side of the array layer away from the substrate. The light-emitting layer includes light-emitting elements. The display panel also includes a color filter layer located on a side of the light-emitting layer away from the substrate. The color filter layer includes color filter openings. In the display area, the color filter openings include a first color filter opening and a second color filter opening. The first color filter opening is located between the second color filter opening and an edge of the display panel. An orthographic projection area of the first color filter opening on the substrate is larger than an orthographic projection area of the second color filter opening on the substrate.

20 Claims, 10 Drawing Sheets

DISPLAY PANEL AND DISPLAY DEVICE WITH BALANCED BRIGHTNESS DIFFERENCE BETWEEN EDGE AND CENTER OF DISPLAY AREA

CROSS-REFERENCE TO RELATED APPLICATION

This application claims priority of Chinese Patent Application No. 202011193480.X, filed on Oct. 30, 2020, the entire content of which is hereby incorporated by reference.

FIELD OF THE DISCLOSURE

The present disclosure generally relates to the field of display technology and, more particularly, relates to a display panel and display device.

BACKGROUND

Flat display devices have advantages such as thin body and power saving, and have been widely used. Existing flat display devices mainly include liquid crystal display (LCD) devices and organic light-emitting diode (OLED) display devices.

An OLED display device may include a substrate, an anode disposed on the substrate, a hole-injection layer disposed on the anode, a hole-transport layer disposed on the hole-injection layer, a light-emitting layer disposed on the hole-transport layer, an electron-transport layer disposed on the light-emitting layer, an electron-injection layer disposed on the electron-transport layer, and a cathode disposed on the electron-injection layer. A light-emitting principle of OLED display devices is that, under driven by an electric field, semiconductor materials and organic light-emitting materials may emit light through carrier injection and recombination. Specifically, an OLED display device may use an ITO pixel electrode and a metal electrode as an anode and a cathode of the device, respectively. Driven by a certain voltage, electrons and holes may be injected from the cathode and the anode into the electron transport layer and the hole transport layer, respectively. The electrons and the holes may migrate through the electron transport layer and the hole transport layer to the light-emitting layer. The electrons and the holes may meet in the light-emitting layer and form excitons. The excitons may excite light-emitting molecules, and the light-emitting molecules may emit visible light after radiation relaxation.

OLED display may have an issue of uneven brightness at an edge of an OLED display panel, and user experiences may thus be affected. Improvement of OLED display uniformity has become an urgent technical problem to be addressed in the display field. The disclosed structures and methods are directed to solve one or more problems set forth above and other problems in the art.

SUMMARY

One aspect of the present disclosure includes a display panel. The display panel includes a display area, a substrate, an array layer located on a side of the substrate, and a light-emitting layer located on a side of the array layer away from the substrate. The light-emitting layer includes a plurality of light-emitting elements arranged in an array. The display panel also includes a color filter layer located on a side of the light-emitting layer away from the substrate. The color filter layer includes a plurality of color filter openings, and the plurality of color filter openings is arranged in one-to-one correspondence with the plurality of light-emitting elements. In the display area, the plurality of color filter openings includes a first color filter opening and a second color filter opening. The first color filter opening is located between the second color filter opening and an edge of the display panel. An orthographic projection area of the first color filter opening on the substrate is larger than an orthographic projection area of the second color filter opening on the substrate.

Another aspect of the present disclosure includes a display device. The display device includes a display panel. The display panel includes a display area, a substrate, an array layer located on a side of the substrate, and a light-emitting layer located on a side of the array layer away from the substrate. The light-emitting layer includes a plurality of light-emitting elements arranged in an array. The display panel also includes a color filter layer located on a side of the light-emitting layer away from the substrate. The color filter layer includes a plurality of color filter openings, and the plurality of color filter openings is arranged in one-to-one correspondence with the plurality of light-emitting elements. In the display area, the plurality of color filter openings includes a first color filter opening and a second color filter opening. The first color filter opening is located between the second color filter opening and an edge of the display panel. An orthographic projection area of the first color filter opening on the substrate is larger than an orthographic projection area of the second color filter opening on the substrate.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

It should be noted that relative arrangements of components and steps, numerical expressions and numerical values set forth in exemplary embodiments are for illustration purpose only and are not intended to limit the present disclosure unless otherwise specified. Techniques, methods and apparatus known to the skilled in the relevant art may not be discussed in detail, but these techniques, methods and apparatus should be considered as a part of the specification, where appropriate.

It should be noted that in the present disclosure, relational terms such as "first" and "second" are used only to distinguish one entity or operation from another entity or operation, and do not necessarily require or imply any such actual relationship or order between these entities or operations. Moreover, terms "include", "comprise" or any other variations thereof are intended to cover non-exclusive inclusion. A process, a method, an article, or an equipment including a series of elements may not only include those elements, but also include other elements that are not explicitly listed, or elements inherent to the process, the method, the article, or the equipment. Without additional restrictions, when a phrase "including . . . " is used to identify an element, other identical elements may exist in a process, a method, an article, or an equipment including the element.

OLED display may have an issue of uneven brightness at an edge of an OLED display panel, and user experiences may thus be affected. To address this issue, the present disclosure provides a display panel and a display device that may balance brightness difference between an edge of a display area and a center of the display area. Accordingly, brightness consistency of the display panel may be improved, and display uniformity may thus be improved.

Figure 1:
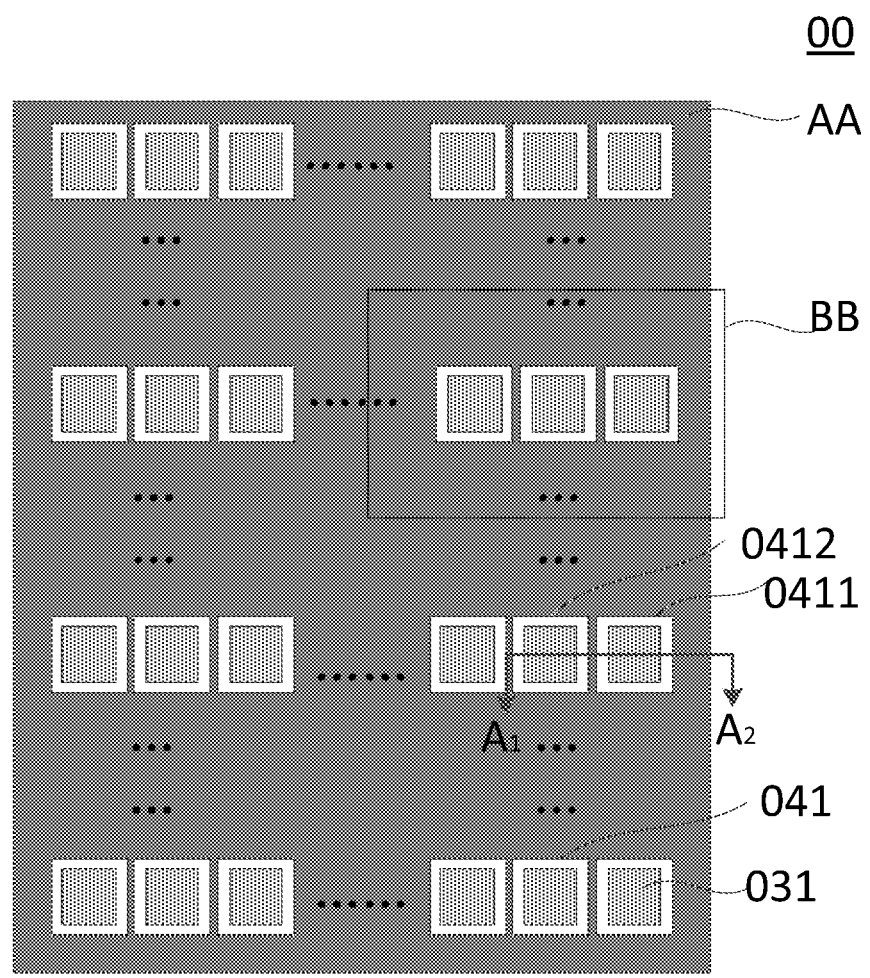
FIG. 1 illustrates a schematic diagram of a display panel consistent with the disclosed embodiments of the present disclosure.
Figure 2:
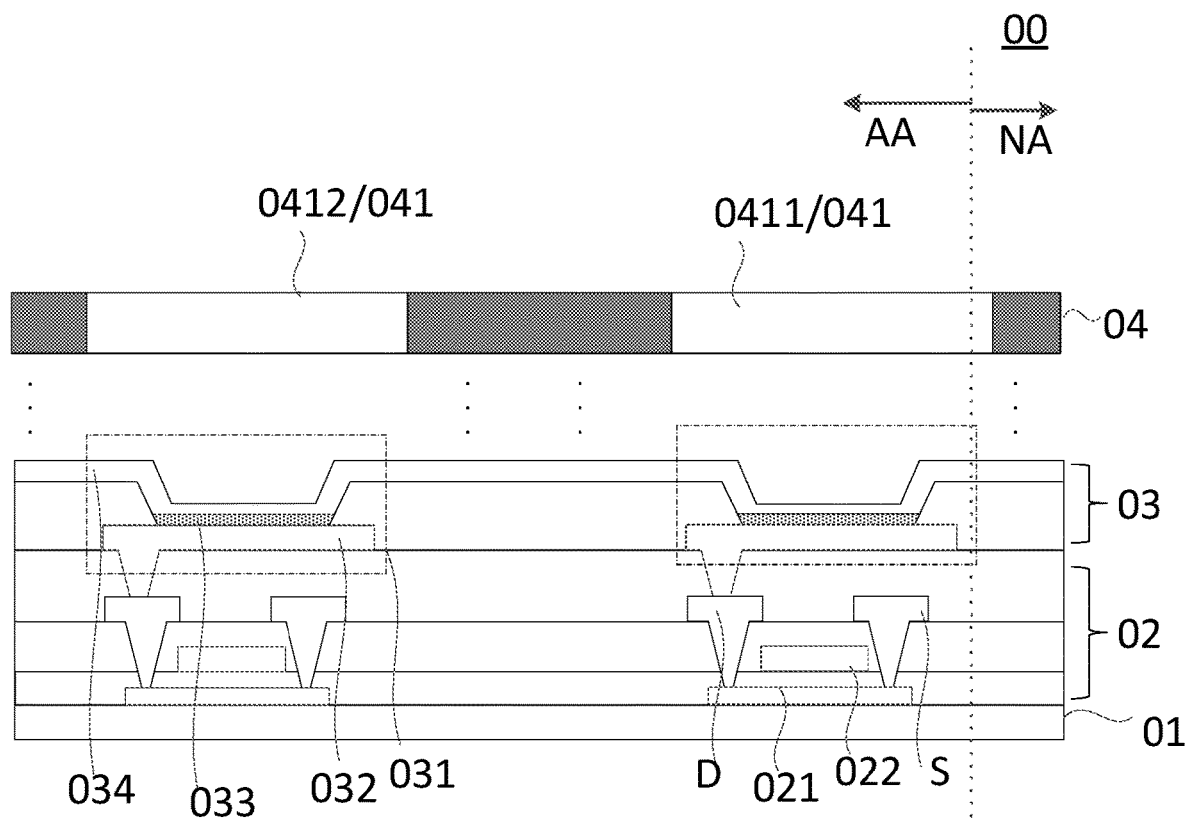
FIG. 2 illustrates a schematic diagram at cross section A1A2 of a display panel shown in FIG. 1, consistent with the disclosed embodiments of the present disclosure.

FIG. 1 illustrates a schematic diagram of a display panel consistent with the disclosed embodiments of the present disclosure. FIG. 2 illustrates a schematic diagram at cross section A1A2 of a display panel shown in FIG. 1. With reference to FIG. 1 and FIG. 2, the display panel 00 includes a display area AA. The display panel 00 also includes a substrate 01, and an array layer 02 located on a side of the substrate 01. The array layer may include a thin film transistor. The thin film transistor includes an active layer 021, a gate terminal 022, and source/drain terminal S/D. The display panel 00 also includes a light-emitting layer 03, located on a side of the array layer 02 away from the substrate. The light-emitting layer 03 includes a plurality of light-emitting elements 031 arranged in an array. The light-emitting element 031 includes an anode 032, a light-emitting functional layer 033, and a cathode 034. The light-emitting elements may include light-emitting elements that emit light of different colors. In one embodiment, the light-emitting elements 031 include a blue light-emitting element that emits blue light, a green light-emitting element emitting green light, and a red light-emitting element emitting red light.

The display panel 00 also includes a color filter layer 04. The color filter layer 04 is located on a side of the light-emitting layer 03 away from the substrate 01. The color filter layer 04 includes a plurality of color filter openings 041, and the plurality of color filter openings 041 are arranged in one-to-one correspondence with the light-emitting elements 031 of the light-emitting layer 03. That is, each light-emitting element 031 corresponds to a different color filter opening 041 on the color filter layer 04. In a direction perpendicular to a plane of the display panel 00, the light-emitting element 031 overlaps a corresponding color filter opening 041. By setting the color filter opening 041 on the color filter layer 04, a light transmittance rate of the light-emitting element 031 on the color filter layer 04 may be improved.

By replacing a polarizer (POL) with a color filter (CF), the CF may absorb ambient light entering the display panel, thereby reducing impact of the ambient light on the display panel after being reflected by the display panel. Compared with a polarizer with a thickness of approximately 100 µm or more, a thickness of a CF may be reduced to approximately 5 µm. Accordingly, a thickness of the display panel may be reduced, a light transmittance rate may be increased, and brightness of the entire display panel may be improved.

With continuous reference to FIG. 1 and FIG. 2, in the display area AA, the color filter opening 041 includes a first color filter opening 0411 and a second color filter opening 0412. The first color filter opening 0411 is located between the second color filter opening 0412 and the edge of the display panel 00. In other words, compared to the second color filter opening 0412, the first color filter opening 0411 is closer to the edge of the display panel 00. That is, the first color filter opening 0411 is closer to the non-display area NA of the display panel 00. The non-display area NA at least partially surrounds the display area AA. It may also be understood that the second color filter opening 0412 is located on a side of the first color filter opening 0411 away from the non-display area NA. An orthographic projection area of the first color filter opening 0411 on the substrate 01 is larger than an orthographic projection area of the second color filter opening 0412 on the substrate 01. In other words, an area of the first color filter opening 0411 is larger than an area of the second color filter opening 0412. By setting the orthographic projection area of the first color filter opening 0411 on the substrate 01 to be larger than the orthographic projection area of the second color filter opening 0412 on the substrate 01, the light transmittance rate of the light-emitting element corresponding to the first color filter opening on the color filter layer may be increased. Accordingly, by setting color filter openings of different sizes in the color filter layer, the brightness difference between the edge of the display area and the center of the display area may be balanced. Thus, the brightness consistency of the display panel may be improved, and the display uniformity may be improved.

In a display panel provided by the present disclosure, on one hand, by replacing a conventional polarizer with a color filter layer, not only a thickness of the display panel may be reduced, but also a light transmittance rate may be increased and brightness of the entire display panel may be improved. On the other hand, in the display area, the color filter openings may include a first color filter opening and a second color filter opening. The first color filter opening is located between the second color filter opening and an edge of the display panel. An orthographic projection area of the first color filter opening on a substrate is larger than an orthographic projection area of the second color filter opening on the substrate. By setting the orthographic projection area of the first color filter opening on the substrate to be larger than the orthographic projection area of the second color filter opening on the substrate, the light transmittance rate of the light-emitting element corresponding to the first color filter opening in the color filter layer may be increased. By setting color filter openings with different sizes in the color filter layer to balance brightness difference between the edge of the display area and the center of the display area, brightness consistency of the display panel may be improved, and display uniformity may be improved.

In one embodiment, in a first direction, the orthographic projection areas of at least part of the color filter openings on the substrate gradually increase. The first direction is a direction from the display area to the edge of the display panel.

Figure 3:
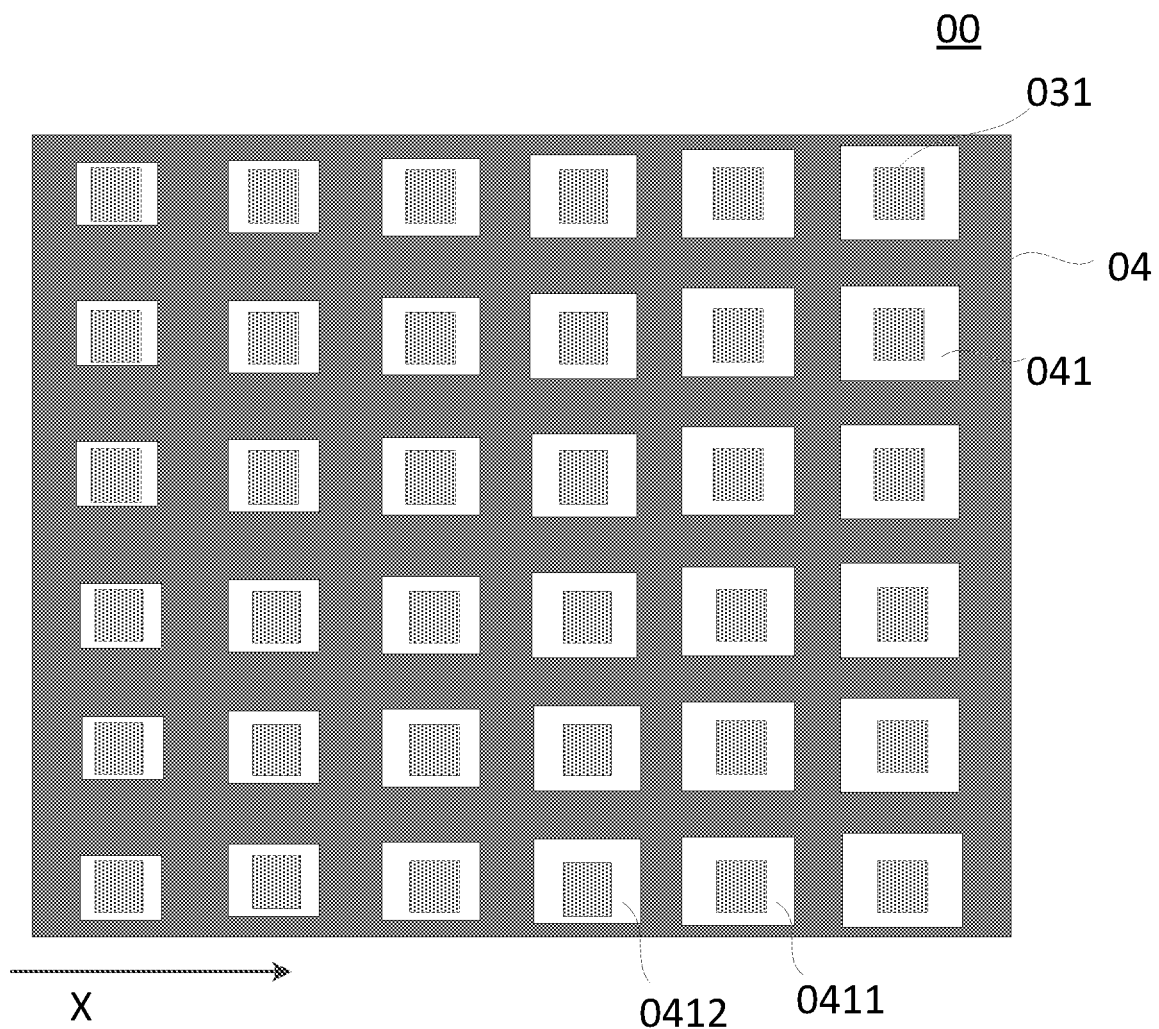
FIG. 3 illustrates is a partially enlarged schematic diagram at area BB of a display panel shown in FIG. 1, consistent with the disclosed embodiments of the present disclosure.

FIG. 3 illustrates is a partially enlarged schematic diagram at area BB of a display panel shown in FIG. 1. With reference to FIGS. 1 to 3, in a first direction X, the orthographic projection areas of at least part of the color filter openings 041 on the substrate 01 gradually become larger. The first direction is a direction from the display area to the edge of the display panel. Since an edge of the display area may have low brightness, when the brightness of the edge of the display area AA is increased, a sudden change in the brightness of a certain area of the display panel 00 may appear, and thus the display effect may be affected. For example, bright and dark lines may appear. In the present disclosure, by setting the areas of the color filter openings 041 to gradually change in the first direction X, the display brightness near the edge of the display panel 00 may be improved, and new display defects may be avoided.

In one embodiment, in the first direction, the orthographic projection areas of the color filter openings on the substrate change with a substantially equal difference. With continuous reference to FIG. 3, in the first direction X, the orthographic projection areas of the color filter openings on the substrate change with a substantially equal difference. That is, in the first direction X, differences between areas of two adjacent color filter openings are substantially equal. Accordingly, in the first direction, differences in the light transmittance rates of the light-emitting elements corresponding to adjacent color filter openings on the color filter layer are also substantially equal. By setting the areas of the color filter openings to change with a substantially equal difference, the light transmittance rate of color filter layer corresponding to the light-emitting elements may increase in a substantially equal proportion. Accordingly, brightness difference between the edge of the display area and the center of the display area may be balanced. Thus, the brightness consistency of the display panel may be improved, and the display uniformity may be improved. Meanwhile, since the areas of the color filter openings change with a substantially equal difference, unbalanced display brightness caused by uneven change of the color filter openings may be avoided.

In one embodiment, the color filter openings also include a third color filter opening. The third color filter opening is located on a side of the second color filter opening away from the first color filter opening. An orthographic projection area of the third color filter opening on the substrate may be less than or substantially equal to the orthographic projection area of the second color filter opening on the substrate.

Figure 4:
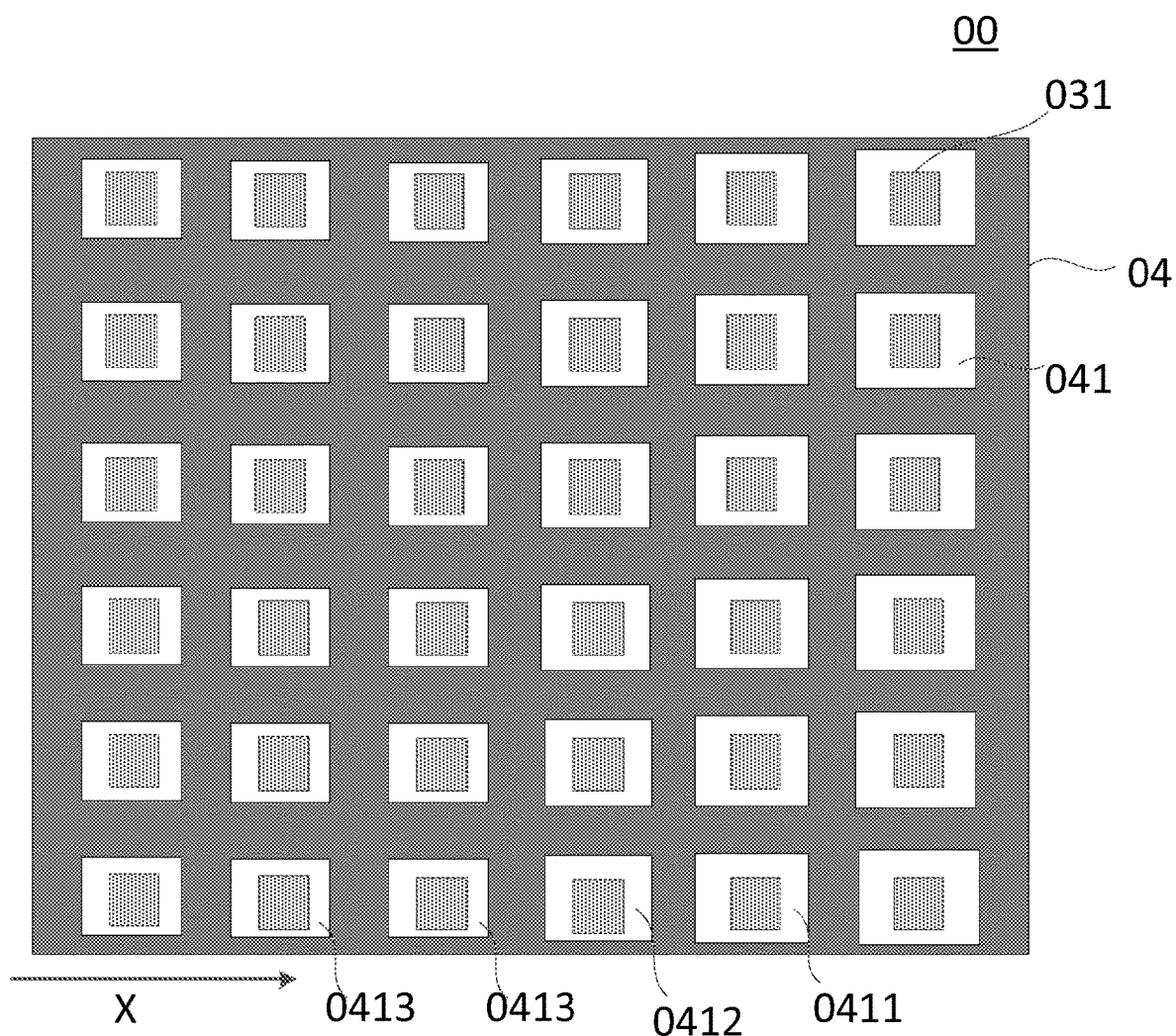
FIG. 4 illustrates is a partially enlarged schematic diagram at area BB of another display panel shown in FIG. 1, consistent with the disclosed embodiments of the present disclosure.

FIG. 4 illustrates is a partially enlarged schematic diagram at area BB of another display panel shown in FIG. 1. With reference to FIGS. 1 to 4, the color filter openings 041 also include a third color filter opening 0413. The third color filter opening 0413 is located on a side of the second color filter opening 0412 away from the first color filter opening 0411. That is, the third color filter opening 0413 is farther away from the edge of the display panel than the second color filter opening 0412. An orthographic projection area of the third color filter opening 0413 on the substrate 01 may be smaller than or substantially equal to the orthographic projection area of the second color filter opening 0412. The third color filter opening 0413 is farther away from the edge of the display panel than the first color filter opening 0411 and the second color filter opening 0412. That is, the third color filter opening 0413 is closer to the center area of the display panel than the first color filter opening 0411 and the second color filter opening 0412. In the central display area of the display panel, a problem of display brightness uniformity is small or there is no problem of brightness uniformity. Thus, sizes of the third color filter opening 0413 and the second color filter opening 0412 may be same, or the area of the third color filter opening 0413 may be smaller than the area of the second color filter opening 0412. As such, the brightness of the normal display area may not be affected. It should be noted that a central area of the display panel may be understood as a geometric center of the display area.

In one embodiment, the display panel also includes an encapsulation layer. The encapsulation layer is located between the light-emitting layer and the color filter layer. A thickness of the encapsulation layer corresponding to the first color filter opening is smaller than a thickness of the encapsulation layer corresponding to the second color filter opening. The color filter layer also includes a plurality of color resist units arranged in one-to-one correspondence with the light-emitting elements. The color resist units may include a first color resist at least at the first color filter opening, and a second color resist at least at the second color filter opening.

Figure 5:
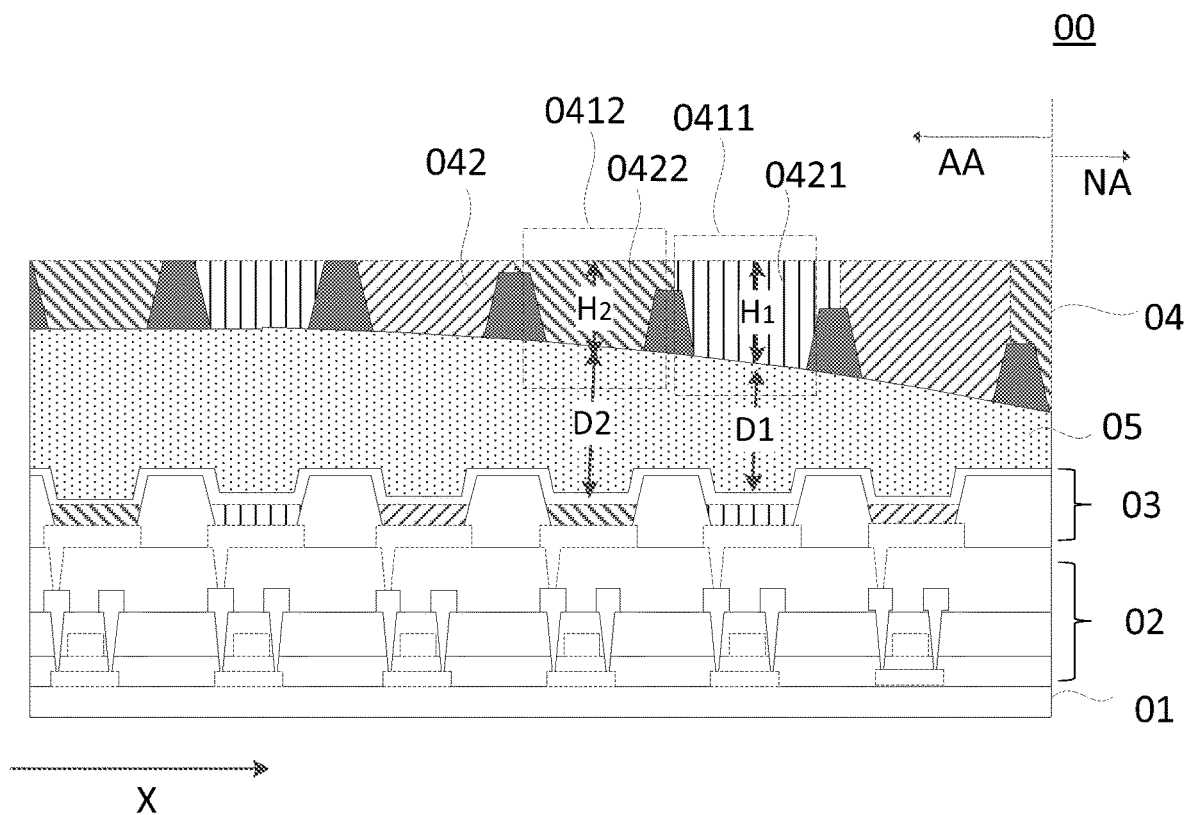
FIG. 5 illustrates a schematic diagram of another display panel consistent with the disclosed embodiments of the present disclosure.

FIG. 5 illustrates a schematic diagram of another display panel consistent with the disclosed embodiments of the present disclosure. As shown in FIG. 5, the display panel 00 also includes an encapsulation layer 05. The encapsulation layer 05 is located between the light-emitting layer 03 and the color filter layer 04. A thickness D1 of the encapsulation layer 05 corresponding to the first color filter opening 0411 is smaller than a thickness D2 of the encapsulation layer 05 corresponding to the second color filter opening 0412, that is, D1<D2. The color filter layer 04 also includes color resist units 042 arranged in one-to-one correspondence with the light-emitting elements. The color resist units 042 include a first color resist 0421 at least at the first color filter opening 0411, and a second color resist 0422 at least at the second color filter opening 0412. The color resist unit 042 and the corresponding light-emitting element have a same light-emission color. A thickness H1 of the first color resist is greater than a thickness H2 of the second color resist, that is, H2<H1.

It should be noted that a thickness of a film layer defined in the present disclosure may be understood as a width of the film layer in a direction perpendicular to a plane of the substrate.

It should be noted that, generally speaking, there are certain color resist units in non-color filter opening areas, and a thickness of the color resist unit may be understood as the thickness of the color resist unit in the color filter opening area.

To improve the light exiting rate of the display panel, a color filter (CF) may be configured to replace a polarizer (POL). The CF may absorb ambient light entering the display panel, thereby reducing impact of the ambient light on the display panel after being reflected by the display panel. Compared with a polarizer with a thickness of approximately 100 μm or more, a thickness of a CF may be reduced to approximately 5 μm. Accordingly, a thickness of the display panel may be reduced. As such, application of OLED display panels may be extended, such as development of dynamic bending products. In addition, the light transmittance rate may be increased, and the brightness of the entire display screen may be improved.

A CF material may have viscosity in a range of approximately 3 cp to 5 cp. The CF material may be coated on the encapsulation layer. The encapsulation layer may include two stacked inorganic layers and an organic layer sandwiched between the two stacked inorganic layers. The two stacked inorganic layers may prevent water vapor from intruding from sides to affect electrical performance of the light-emitting elements. The organic layer may have high elasticity. The organic layer may inhibit cracking of the two stacked inorganic layers and release stress between the two stacked inorganic substances. The organic layer may also improve flexibility of the entire encapsulation layer, thereby realizing reliable and flexible encapsulation.

The inventor has further found, by researched, that when the organic layer of the encapsulation layer is made by inkjet printing process, due to flow characteristics of inkjet printing, a thickness of the organic layer near an edge of the display panel may gradually decrease. Accordingly, the thickness of the encapsulation layer at the edge of the display panel may gradually decrease. When CF is coated on the encapsulation layer, the film layer of CF may be thicker at a position where the encapsulation layer is thinner. Thus, the thickness of the edge of the display panel which the light emitted by the light-emitting element transmits through may gradually become thicker, resulting in uneven brightness of the display panel as a whole.

With continuous reference to FIG. 5, the thickness of the encapsulation layer 05 corresponding to the first color filter opening 0411 is relatively small, and the thickness of the first color resist 0421 corresponding to the first color filter opening 0411 is relatively large. Since the thickness of the first color resist 0421 increases, the transmittance rate of the light emitted by the light-emitting element 031 corresponding to the first color filter opening 0411 may decrease. The thickness H1 of the first color resist is greater than the thickness H2 of the second color resist. The light transmittance rate of the light-emitting element 031 corresponding to the first color filter opening 0411 on the color filter layer 04 may be lower than the light transmittance rate of the light-emitting element corresponding to the second color filter opening 0412 on the color filter layer 04. As a result, the brightness at the edge of the display panel may decrease, and the edge display brightness may decrease. Accordingly, the display may be abnormal, and user experience may be affected.

To solve this technical problem, in the present disclosure, the area of the first color filter opening 0411 is set to be larger than the area of the second color filter opening 0412. Accordingly, the orthographic projection area of the first color filter opening 0411 on the substrate 01 is set to be larger than the orthographic projection area of the second color filter opening 0412 on the substrate 01. Thus, the orthographic projection area of the first color resist 0421 filled in the first color filter opening 0411 on the substrate 01 is larger than the orthographic projection area of the second color resist 0422 filled in the second color filter opening 0412 on the substrate 01.

The brightness L of the light-emitting element passing through a color resist unit is given by $L=k*S*Tr$. S is an effective light-exiting area when light emitted by the light-emitting element passes through the color filter layer. The effective light-exiting area may generally be understood as the area of the color filter opening. Tr is transmittance rate of the color resist unit to the light, and k is a proportional coefficient. Accordingly, by increasing the area of the first color resist 0421, increasing the effective light exiting area S of the light-emitting element corresponding to the first color filter opening 0411, with the light transmittance rate of the first color resist 0421 unchanged (Tr unchanged), the display brightness of the light-emitting element on the color filter layer 04 may also be increased. In this way, the transmittance of the light-emitting element near the edge of the display panel may be increased. As such, the display brightness at the edge of the display area may be increased, the brightness difference between the center of the display panel and the edge of the display area may be balanced, and thus the display uniformity may be improved.

In one embodiment, with reference to FIGS. 3 and 5, in a direction from the display area AA to the non-display area NA, the thickness of the encapsulation layer 05 gradually decreases, and a thickness of the color resist unit corresponding to the encapsulation layer in a direction perpendicular to the substrate 00 gradually increases. In a first direction X, the orthographic projection areas of at least part of the color filter openings 041 on the substrate 01 gradually become larger. The first direction X is a direction from the display area to the edge of the display panel. Since the encapsulation layer 05 at the edge of the display area gradually becomes thinner, and the color resist unit 042 becomes gradually thicker, the display area near the edge of the display panel may thus have lower brightness. When the brightness of the edge of the display area AA is increased, a sudden change in the brightness of a certain area of the display panel 00 may occur, and thus the display effects may be affected, for example, bright and dark lines may appear. But, by gradually changing areas of the color filter openings 041 in the first direction X, the display brightness near the edge of the display panel 00 may be increased, and meanwhile display defects may not appear.

It should be noted that the area of the color filter opening is not same as the area of the color resist unit corresponding to the color filter opening. The color resist unit may directly fill the color filter opening by coating, and may extend to a non-opening part of the color film. Accordingly, an area of the color resist unit may be larger than an area of the color filter opening at a corresponding position. An effective light-emitting area of a light-emitting element is directly related to the area of the color filter opening, rather than the area of the color resist unit.

In one embodiment, the thickness of the first color resist is $H_1$, the orthographic projection area of the first color filter opening on the substrate is $S_1$, and the transmittance rate of the first color resist is Tr, where $$Tr \propto \frac{1}{H_1}.$$

The brightness of the light of the light-emitting element through the first color resist is L, where L=k*$S_1$*Tr, L∝$S_1$, k is a proportional coefficient, and k is related to light-emitting efficiency of the light-emitting element.

Figure 6:
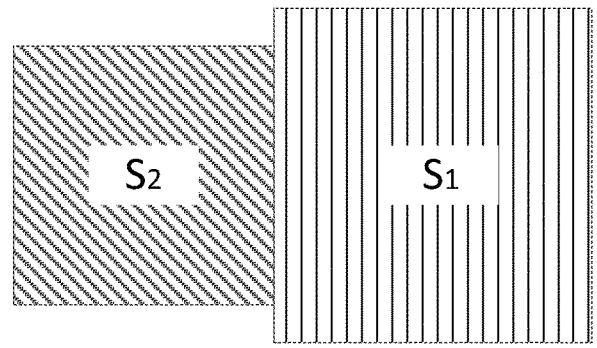
FIG. 6 illustrates an orthographic projection of a first color filter opening and a second color filter opening of a display panel shown in FIG. 5 on a substrate, consistent with the disclosed embodiments of the present disclosure.

FIG. 6 illustrates an orthographic projection of a first color filter opening and a second color filter opening of a display panel shown in FIG. 5 on a substrate. With reference to FIGS. 5 and 6, a thickness of the first color resist 0421 is $H_1$. The thickness of the first color resist is a thickness of the first color resist 0421 in an area where the first color filter opening 0411 is located. The orthographic projection area of the first color filter opening on the substrate is $S_1$, and the transmittance rate of the first color resist 0421 is Tr, where $$Tr \propto \frac{1}{H_1}.$$

The brightness of the light of the light-emitting element 031 through the first color resist 0421 is L, where L=k*$S_1$*Tr, L∝$S_1$, k is a proportional coefficient, related to light-emitting efficiency of the light-emitting element, and k is a positive number. Accordingly, the area of the first color filter opening is positively correlated with the brightness L of the light of the corresponding light-emitting element 031 through the first color resist 0421. By increasing the area of the first color filter opening at a position where the display brightness of the light-emitting element 031 is relatively low, the display brightness may be improved, and the display uniformity may be improved.

In one embodiment, a thickness of the second color resist is $H_2$, and an orthographic projection area of the second color filter opening on the substrate is $S_2$, where $$H_1 > H_2, S_1 > S_2, \frac{S1}{S2} \propto \frac{1}{(H_1 - H_2)}.$$

Since the thickness of the second color resist is smaller than the thickness of the first color resist, the area of the first color filter opening 0411 is increased correspondingly to balance the brightness at the positions of the first color resist and the second color resist, and balance the difference in display brightness. That is, a color filter opening corresponding to a larger thickness of the color resist unit may have a larger area. A ratio of the area of the first color filter opening to the area of the second color filter opening is positively correlated with $$\frac{1}{(H_1 - H_2)}.$$

The increase in the area of the color filter opening may balance the loss of brightness caused by the increase in the thickness of the color resist unit, and the display effect may thus be improved.

It should be noted that the first color filter opening and the second color filter opening illustrate relative positions relative to the edge of the display panel, the edge of the display area, or the non-display area. Marks in the accompanying drawings of the present disclosure do not represent actual fixed positions. Positions of the color filter openings are not fixed in the present disclosure.

In one embodiment, $(S_1-S_2)/S_1 \leqslant 10\%$.

The inventor has further found, by research, that, when the thickness difference between the first color resist 0421 and the second color resist 0422 is approximately 1 μm, with the first color filter opening 0411 and the second color filter opening 0412 as described above, the light transmittance rates of the light-emitting unit corresponding to the first color resist 0421 and the second color resist 0422, respectively, may differ by about 10%. A good display effect may require that $(S_1-S_2)/S_1 \leqslant 10\%$. When $(S_1-S_2)/S_1$ is too large, the brightness at the edge of the display area of the display panel may be greater than the brightness at the center of the display area. As such, a jagged effect at the edge of the display area may be obvious, and thus new display problems may appear.

Figure 7:
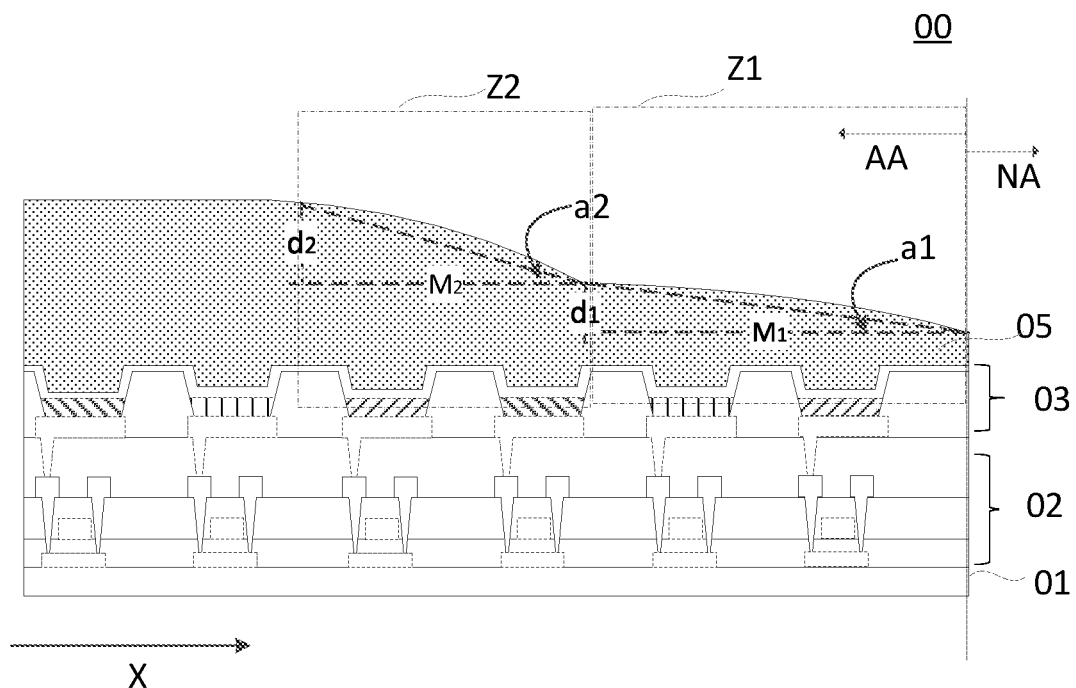
FIG. 7 illustrates a schematic diagram of another display panel consistent with the disclosed embodiments of the present disclosure.
Figure 8:
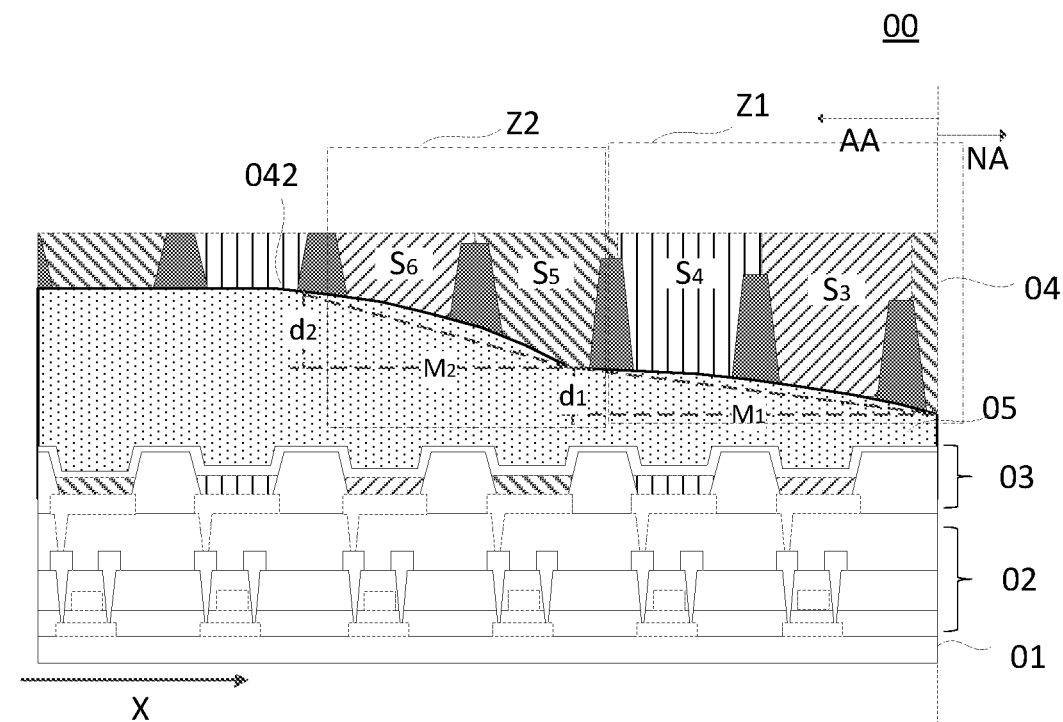
FIG. 8 illustrates a schematic diagram of another display panel consistent with the disclosed embodiments of the present disclosure.

FIG. 7 illustrates a schematic diagram of another display panel. FIG. 8 illustrates a schematic diagram of another display panel. With reference to FIG. 7 and FIG. 8, in the display area AA, the encapsulation layer 05 includes a climbing section. In a direction X from the display area AA to the edge of the display area AA, that is, in the direction X from the display area AA to the non-display area NA, a thickness of the climbing section in a second direction Y gradually decreases. The second direction Y is a direction perpendicular to the substrate and pointing to the light exiting surface of the display panel. The organic layer of the encapsulation layer may be made by an inkjet printing process. Due to flow characteristics of inkjet printing, the thickness of the organic layer near the edge of the display panel may gradually decrease, resulting in a climbing section.

The climbing section includes a first sub-zone Z1 and a second sub-zone Z2. The first sub-zone Z1 is located on a side of the second sub-zone Z2 close to the edge of the display panel. A width of the first sub-zone $Z_1$ in the first direction X is $M_1$, a height of the first sub-zone Z1 in the second direction Y is $d_1$, and tan $$\alpha_1 = \frac{d_1}{M_1},$$

where $\alpha_1$ is a slope angle of the climbing section in the first sub-zone. A width of the second sub-zone Z2 in the first direction is $M_2$, a height of the second sub-zone Z2 in the second direction Y is $d_2$, and tan $$\alpha_2 = \frac{d_2}{M_2},$$

where $\alpha_2$ is the slope angle of the climbing sub-section in the second sub-zone Z2, and $\alpha_1 < \alpha_2$. In the first sub-zone Z1, difference in the orthographic projection areas of the adjacent color filter openings 041 on the substrate 01 is $\Delta S_1$. In the second sub-zone Z2, difference in the orthographic projection area of the adjacent color filter openings 041 on the substrate is $\Delta S_2$, where $\Delta S_2 > \Delta S_1$.

With reference to FIG. 8, in the first sub-zone Z1, the difference in the orthographic projection areas between the adjacent color filter openings 041 on the substrate 01 is $\Delta S_1$, where $\Delta S_1 = |S_4 - S_3|$. In the second sub-zone Z2, the difference in orthographic projection area of the adjacent color filter openings 041 on the substrate is $\Delta S_2$, where $\Delta S_2 = |S_6 - S_5|$, and $|S_6 - S_5| > |S_4 - S_3|$. Since the organic layer of the encapsulation layer may be disposed by an inkjet printing process, and the flow rate may be different in different areas, areas with different slope angles may be formed in the climbing section. Accordingly, in the direction from the display area AA of the display panel to the non-display area NA, the brightness attenuation rate of the display panel may not be substantially equal. In the configuration shown in FIG. 8, $\alpha 1 < \alpha 2$, that is, the thickness change rate of the encapsulation layer in the second sub-zone Z2 is greater than the thickness change rate of the encapsulation layer 05 in the first sub-zone Z1. Accordingly, for the color resist units 042 corresponding to the encapsulation layer 05, the thickness change rate of the color resist units 042 in the first sub-zone Z1 is less than the thickness change rate of the color resist units 042 in the second sub-zone Z2. In the first sub-zone Z1, the difference in the orthographic projection areas of the adjacent color filter openings 041 on the substrate 01 is $\Delta S_1$. In the second sub-zone Z2, the difference in the orthographic projection areas between the adjacent color filter openings 041 is $\Delta S_2$, where $\Delta S_2 > \Delta S_1$. The difference in the areas of adjacent color filter openings in different regions is different, and the difference in the second sub-zone Z2 is greater than the difference in the first sub-zone Z1. Such a regional setting may better balance the problem of brightness at the edge of the display area caused by the thickness difference of the encapsulation layer, and the display quality may thus be improved.

In one embodiment, the first color resist includes at least one first opening. An orthographic projection area of the at least one first opening on the substrate is smaller than the orthographic projection area of the first color resist on the substrate.

Figure 9:
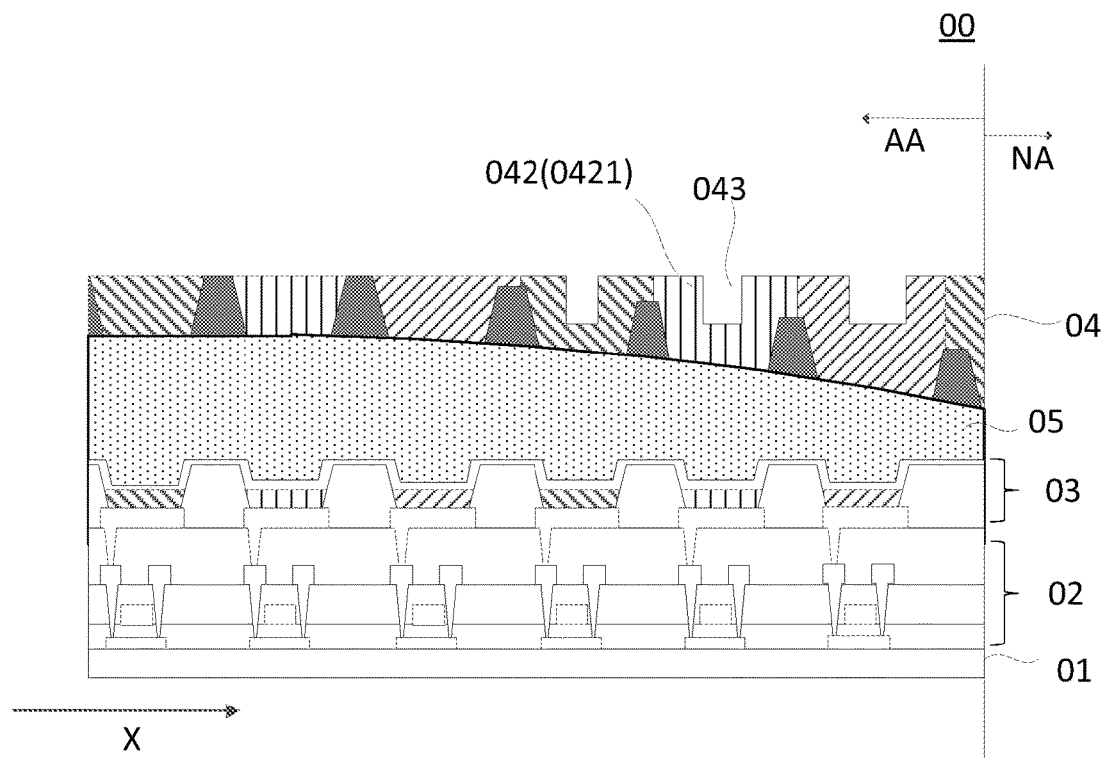
FIG. 9 illustrates a schematic diagram of another display panel consistent with the disclosed embodiments of the present disclosure.
Figure 10:
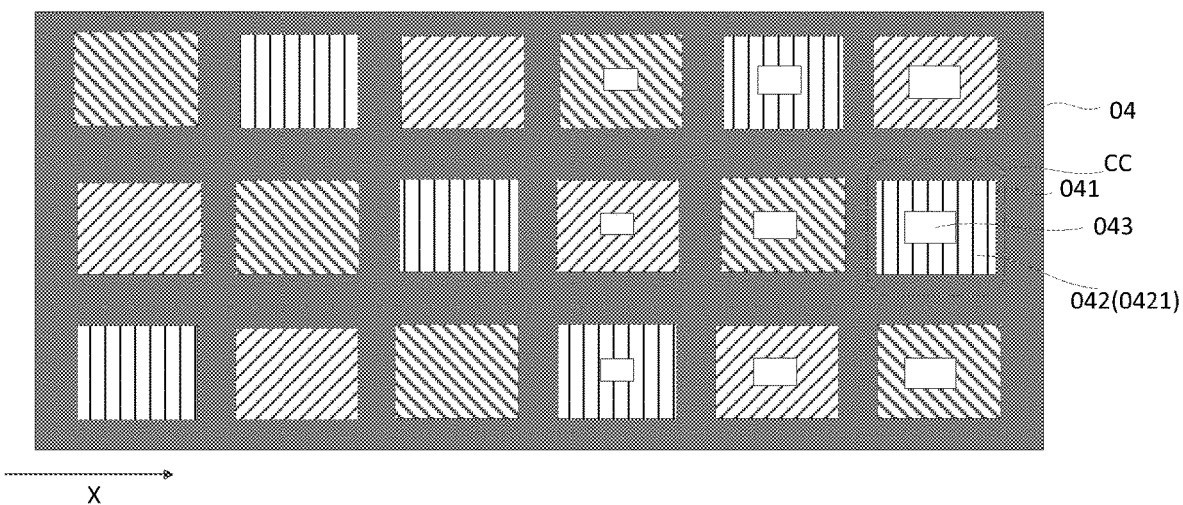
FIG. 10 illustrates is a schematic top view of a display panel shown in FIG. 9, consistent with the disclosed embodiments of the present disclosure.

FIG. 9 illustrates a schematic diagram of another display panel consistent with the disclosed embodiments of the present disclosure. FIG. 10 illustrates is a schematic top view of a display panel shown in FIG. 9. With reference to FIG. 9 and FIG. 10, the first color resist 0421 includes at least one first opening 043. An orthographic projection area of the first opening 043 on the substrate 01 is smaller than the orthographic projection area of the first color resist 0421 on the substrate. In one embodiment, the at least one first opening 043 is provided on the first color resist 0421. The transmittance rate of the light emitted by the light-emitting element 031 through the first opening 043 may be greater than the transmittance rate of the light emitted by the light-emitting element 031 through the first color resist 0421. Accordingly, when the light emitted by the light-emitting element 031 passes through the relatively thick first color resist 0421, the light transmittance rate may be increased by providing at least one first opening 043 on the first color resist 0421.

In one embodiment, a geometric center of the orthographic projection of the light-emitting element corresponding to the first color filter opening on the substrate overlaps a geometric center of the orthographic projection of the first opening on the substrate.

Figure 11:
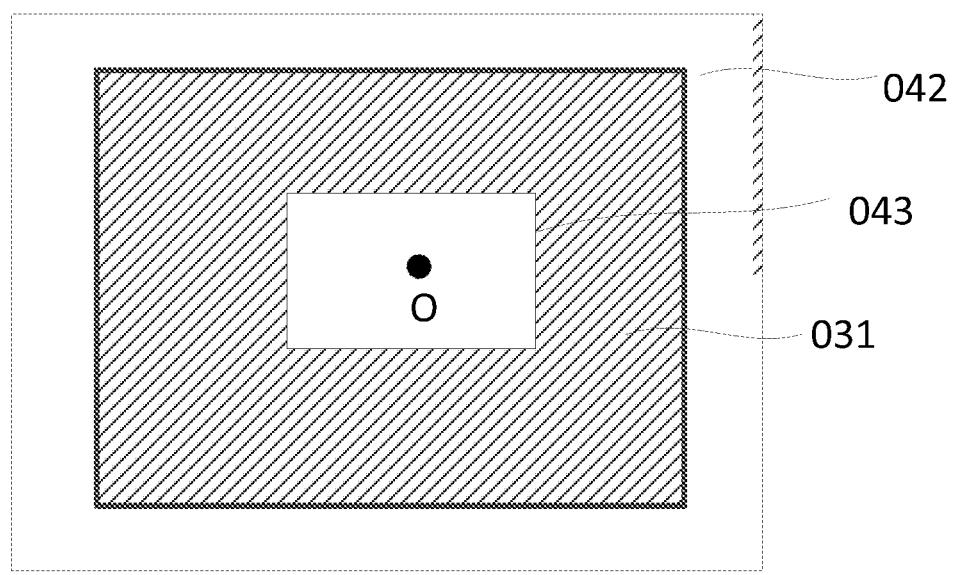
FIG. 11 illustrates a partially enlarged schematic diagram at area CC of a display panel shown in FIG. 10, consistent with the disclosed embodiments of the present disclosure.

FIG. 11 illustrates a partially enlarged schematic diagram at area CC of a display panel shown in FIG. 10. As shown in FIG. 11, a geometric center O of the orthographic projection of the light-emitting element 031 corresponding to the first color filter opening 042 (0421) on the substrate 01 overlaps the geometric center O of the orthographic projection of the first opening 043 on the substrate 01. A shape of the first opening 043 may be a polygonal or irregular shape, such as a circle, an ellipse, and a rectangle.

In one embodiment, the plurality of light-emitting elements 031 with a same light-emission color is in one-to-one correspondence to the plurality of color resist units with a same color, and the light-emitting element 031 has highest light-emitting brightness at the geometric center. The orthographic projection of the first opening 043 on the substrate 01 overlaps the orthographic projection of the corresponding light-emitting element 031 on the substrate 01. Accordingly, the light emitted by the light-emitting element corresponding to the edge of the display area may be transmitted through the first opening 043, and brightness-adjustment sensitivity at the edge of the display area may thus be improved.

In one embodiment, a thickness of the first color resist close to the geometric center of the first color resist is smaller than a thickness of the first color resist away from the geometric center of the first color resist.

With reference to FIG. 9, the thickness of the first color resist 0421 close to the geometric center of the first color resist 0421 is smaller than the thickness of the first color resist 0421 away from the geometric center. By setting a smaller thickness in the central area, the light transmittance rate of the central area may be increased, and the light exiting efficiency may be improved. In one embodiment, the thickness of the first color resist 0421 in the central area is zero. That is, the first opening 043 penetrates the first color resist 0421. Thus, the light transmittance may be increased.

In one embodiment, the first color resist includes of a plurality of first openings, and the plurality of first openings is located on a side of the first color resist away from the geometric center of the first color resist. Distances between the plurality of first openings located on the side of the first color resist away from the geometric center of the first color resist and the geometric center of the first color resist are substantially equal.

Figure 12:
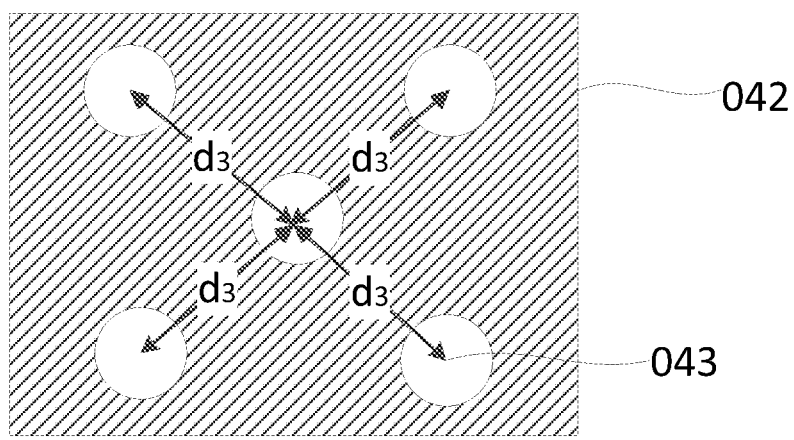
FIG. 12 illustrates a partially enlarged schematic diagram at area CC of another display panel shown in FIG. 10, consistent with the disclosed embodiments of the present disclosure.

FIG. 12 illustrates a partially enlarged schematic diagram at area CC of another display panel shown in FIG. 10. As shown in FIG. 12, the first color resist includes of a plurality of first openings 043. The plurality of first openings 043 is located on a side of the first color resist 042 away from the geometric center of the first color resist 042. The distances between the plurality of first openings 043 located on the side of the first color resist 042 away from the geometric center of the first color resist 042 and the geometric center of the first color resist 042 are substantially equal.

In one embodiment, one first opening 043 is located at the geometric center of the first color resist 042 (0421), and four first openings 043 are arranged in a ring shape at a periphery of the first color resist 042 (0421). The first openings 043 at the periphery and the first opening 043 at the geometric center have a same shape and a same size. The light emitted by the light-emitting element 031 corresponding to the edge of the display area may directly transmit through the plurality of first openings 043 located in the geometric center and distributed in the ring shape at the periphery of the first color resist. The consistency of display brightness may thus be improved.

In one embodiment, the first opening 043 is circular. A distance from each of the four first openings 043 on the periphery of the first color resist 042 (0421) to the geometric center of the first color resist 042 is d3. A distance between two of the first openings 043 may be understood as a distance between the geometric centers of the two first opening 043. When each of the first openings is circular, a distance between two adjacent first openings 043 is a distance between centers of the two adjacent first openings 043. When the plurality of first openings 043 form an axisymmetric or center symmetric structure, the brightness of a light-emitting element in a color filter opening may be uniformly improved, and display uniformity may thus be improved.

Figure 13:
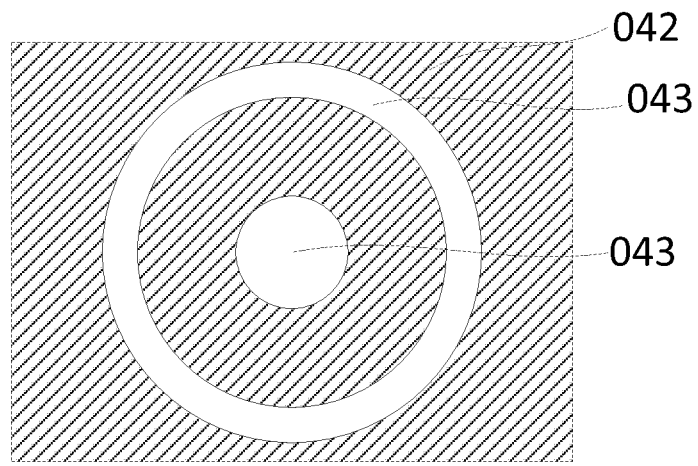
FIG. 13 illustrates a partially enlarged schematic diagram at area CC of another display panel shown in FIG. 10, consistent with the disclosed embodiments of the present disclosure.

FIG. 13 illustrates a partially enlarged schematic diagram at area CC of another display panel shown in FIG. 10. In one embodiment, as shown in FIG. 13, the first openings 043 may also be distributed annularly around the geometric center of the first color resist 0421. The first opening 043 distributed in a ring shape are arranged concentrically with the first openings 043 located at the geometric center. That is, the center of the circle and the center of the ring overlap. The light emitted by the light-emitting element 31 corresponding to the edge of the display area may be directly transmitted through the plurality of first openings 043. Accordingly, the light transmittance rate and brightness consistency of each first color resist 0421 may thus be improved.

In one embodiment, the second color resist includes at least one second opening. An orthographic projection area of the at least one second opening on the substrate is smaller than an orthographic projection area of the second color resist on the substrate. A sum of the of the orthographic projection areas of each the second opening on the substrate is smaller than a sum of the orthographic projection areas of each first opening on the substrate.

With continuous reference to FIGS. 9 to 13, the second color resist 422 includes at least one second opening. An orthographic projection area of the second opening on the substrate is smaller than the orthographic projection area of the second color resist 422 on the substrate. A sum of the orthographic projection areas of each second opening 422 on the substrate is smaller than a sum of the orthographic projection area of each first opening 421 on the substrate. In one embodiment, at least one first opening is located on the first color resist 0421, and at least one second opening is located on the second color resist 0422. The sum of the orthographic projection areas of the first opening of each first color resist 0421 on the substrate 01 is greater than the sum of the orthographic projection areas of the second opening of each second color resist 0422 on the substrate 01. Accordingly, light emitted by the light-emitting element 031 passes through a relatively large first opening on a relatively thick first color resist 0421, and passes through a relatively small second opening on a relatively thin second color resist 0422. Compared with the smaller second opening, the larger first opening may better improve the light transmittance rate of the color resist unit. Thus, the light transmittance rate at positions of different thicknesses in a margin area MA may be balanced.

It should be noted that the first opening, the second opening, and the third opening are not marked in detail in the companying figures. Openings on different color resist units are generally marked with 043 only. It may be understood that an opening on the first color resist is a first opening, and an opening on the second color resist is a second opening.

Figure 14:
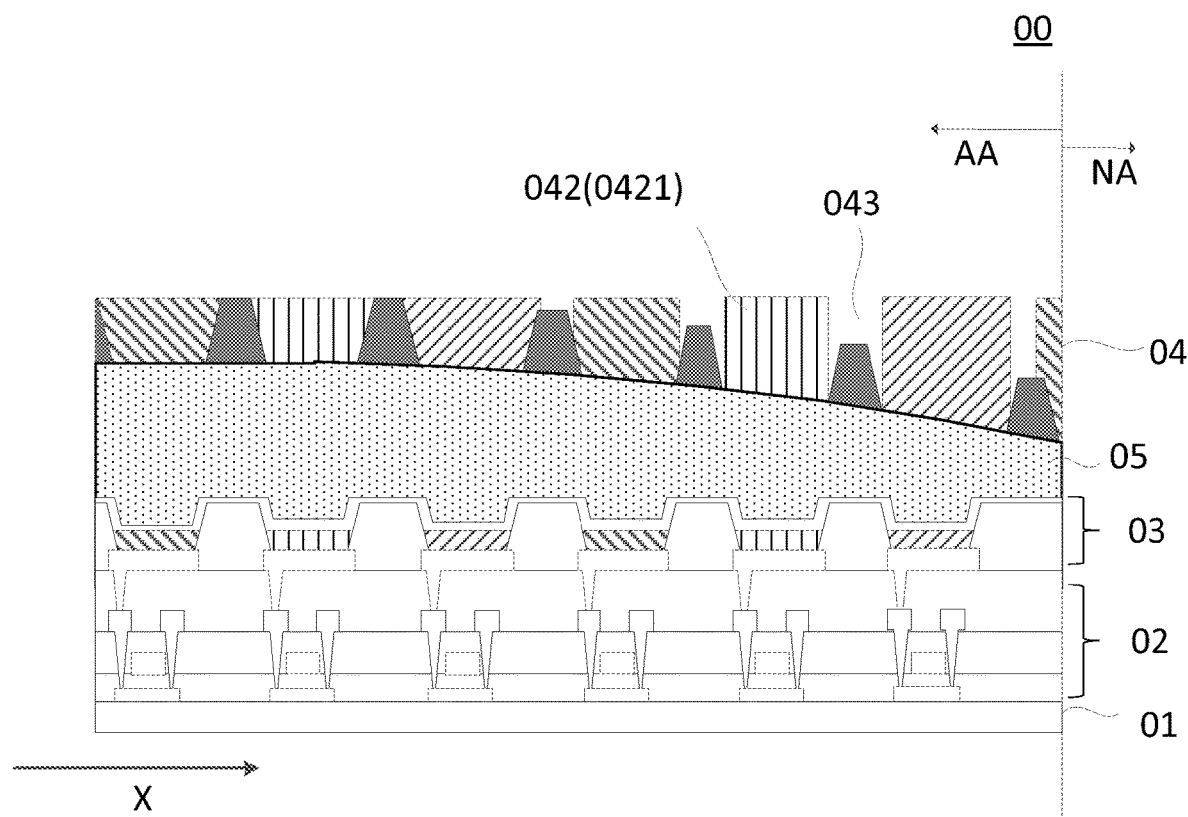
FIG. 14 illustrates a schematic diagram of another display panel consistent with the disclosed embodiments of the present disclosure.

FIG. 14 illustrates a schematic diagram of another display panel consistent with the disclosed embodiments of the present disclosure. As shown in FIG. 14, the color filter layer 04 also includes a black matrix 044. The black matrix 044 is located between adjacent color resist units 042, and the first opening 043 is arranged around the black matrix. The black matrix 044 may be a grid-shaped black matrix, and is configured to prevent light of different colors emitted by light-emitting elements from leaking from gaps between adjacent color resist units and thus causing light mixing. While playing a role of shielding light, the black matrix 044 may also reduce the light transmittance rate of the color resist unit 042 around the black matrix 044. By arranging the first opening 043 around the black matrix 44, the light transmittance rate of the color resist unit on sides of the black matrix 044 may be increased, and the uniformity of display brightness may thus be improved.

In one embodiment, the display panel also includes a non-display area. The non-display area at least partially surrounds the display area. In the display area, the encapsulation layer includes a climbing section. In the climbing section, the encapsulation layer includes at least one thickness variation. The climbing section is located in a region of the encapsulation layer defined by translating a boundary between the display area and the non-display area toward the display area for a preset distance. The preset distance is in a range of approximately 0-3 mm.

Figure 15:
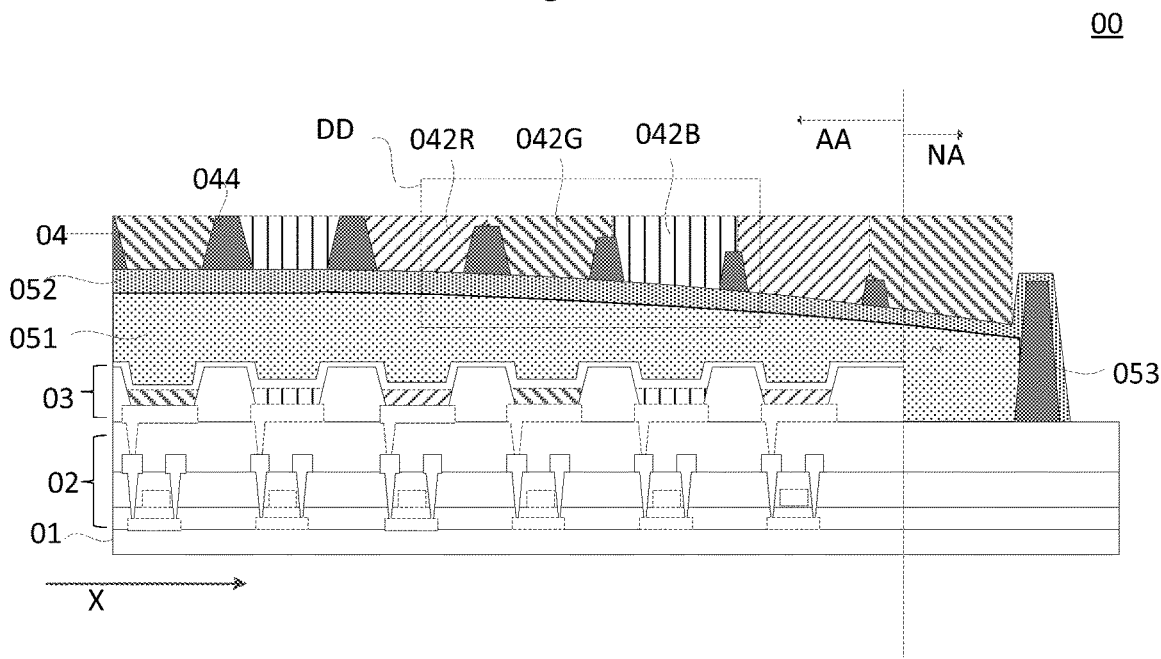
FIG. 15 illustrates a schematic diagram of another display panel consistent with the disclosed embodiments of the present disclosure.

FIG. 15 illustrates a schematic diagram of another display panel consistent with the disclosed embodiments of the present disclosure. As shown in FIG. 15, the display panel 00 also includes a non-display area NA. The non-display area NA at least partially surrounds the display area AA. In the display area AA, the encapsulation layer 05 includes a climbing section. In the climbing section, the thickness of the encapsulation layer 05 varies for at least one variation. In one embodiment, the encapsulation layer includes an inorganic encapsulation layer 052 and an organic encapsulation layer 051. The display panel further includes a retaining wall 053. The retaining wall 053 is configured to block the flow of the organic encapsulation layer during an encapsulation process, and reduce the fluidity of the organic encapsulation layer. The inorganic encapsulation layer 052 may have a good water and oxygen isolation effect. The organic encapsulation layer 051 may have good flexibility, and improve the bending resistance and compression resistance of the display panel.

The climbing section is located in a region of the encapsulation layer defined by translating a boundary between the display area and the non-display area toward the display area for a preset distance. The preset distance is in a range of approximately 0-3 mm. The preset distance is related to a material of the encapsulation layer 05. More specifically, the preset distance is related to flow characteristics of the material of the organic encapsulation layer 051 in the encapsulation layer 05. To alleviate the problem of uneven brightness at the edge of the display area, the preset distance should be small. The preset distance should not be greater than approximately 3 mm. When the preset distance is greater than approximately 3 mm, the material of the organic encapsulation layer may be wasted, and the long flow time of the organic layer may increase the fabrication time of the display panel.

In one embodiment, the first color resist includes a color resist for first color, a color resist for second color and a color resist for third color. A wavelength of the light emitted by the light-emitting element corresponding to the color resist for first color is a first wavelength $\lambda 1$. A wavelength of the light emitted by the light-emitting element corresponding to the color resist for second color is a second wavelength $\lambda 2$. A wavelength of the light emitted by the light-emitting element corresponding to the color resist for third color is a third wavelength $\lambda 3$, where $\lambda 1 < \lambda 2 < \lambda 3$. An orthographic projection area of the first color filter opening corresponding to the color resist for first color on the substrate is larger than an orthographic projection area of the first color filter opening corresponding to the color resist for second color on the substrate. The orthographic projection area of the first color filter opening corresponding to the color resist for first color on the substrate is larger than an orthographic projection area of the first color filter opening corresponding to the color resist for third color on the substrate.

With continuous reference to FIG. 15, the first color resist 042 includes a color resist for first color 042B, a color resist for second color 042G and a color resist for third color 042R. A wavelength of the light emitted by the light-emitting element 031 corresponding to the color resist for first color 042B is a first wavelength $\lambda 1$. A wavelength of the light emitted by the light-emitting element 031 corresponding to the color resist for second color 042G is a second wavelength $\lambda 2$. A wavelength of the light emitted by the light-emitting element 031 corresponding to the color resist for third color 042R is a third wavelength $\lambda 3$, where $\lambda 1 < \lambda 2 < \lambda 3$.

In one embodiment, an orthographic projection area of the first color filter opening 041 corresponding to the color resist for first color 042B on the substrate is larger than an orthographic projection area of the first color filter opening 041 corresponding to the color resist for second color 042G on the substrate.

In one embodiment, the orthographic projection area of the first color filter opening 041 corresponding to the color resist for first color 042B on the substrate is larger than an orthographic projection area of the first color filter opening 041 corresponding to the color resist for third color 042R on the substrate.

Since human eyes are less sensitive to light with a shorter wavelength than light with a longer wavelength, the first color filter opening 043 opened on the color resist for first color 042B may have a largest orthographic projection area on the substrate 01.

In one embodiment, the orthographic projection area of the first color filter opening 043 corresponding to the color resist for second color 042G on the substrate is smaller than the orthographic projection area of the first color filter opening corresponding to the color resist for third color 042R on the substrate 01.

Further, the orthographic projection area of the first color filter opening 043 of the color resist for second color 042G on the substrate 01 is smaller than or substantially equal to the orthographic projection area of the first color filter opening 043 of the color resist for third color 042R on the substrate 01. Since human eyes are more sensitive to the second color light than the third color light, when the opening area of the first color film becomes larger, a brightness increase ratio of the second color is large. The third color light has a large wavelength, and the transmittance rate of the third color light is higher than the transmittance rate of the second color light. When the orthographic projection areas of the first color filter openings 043 of the color resist for second color 042G and the color resist for third color 042R on the substrate 01 are substantially equal, the brightness differences of the two colors may be balanced at a same time. Meanwhile, a same exposure mask may be used for the two first color filter openings 043 of the color resist for second color 042G and the color resist for third color 042R. Accordingly, difficulty and cost of mold production may be reduced, and production efficiency may be improved.

In one embodiment, light-emission colors of the display panel are three primary colors RGB. The color resist for first color 042B is a blue color resist, and the first wavelength $\lambda 1$ is in a range of approximately 440 nm-475 nm. The color resist for second color 042G is a green color resist unit, and the second wavelength $\lambda 2$ is in a range of approximately 492 nm-577 nm. The color resist for third color 042R is a red color resist unit, and the third wavelength $\lambda 3$ is in a range of approximately 625 nm-740 nm. Since the human eyes are more sensitive to red light and green light than blue light, and are most sensitive to green light, the first color filter opening 043 opened on the color resist for blue color has the largest orthographic projection area on the substrate 01. The first color filter opening 043 opened on the color resist for green color may be substantially equal to the first color filter opening 043 opened on the resist on red color. Accordingly, a same exposure mask may be used for opening the first color filter openings on the color resist for green color and the color resist for red color. Thus, difficulty and cost of mold production may be reduced, and production efficiency may be improved.

In some other embodiments, the first color filter opening 043 opened on the color resist for green color may be smaller than the first color filter opening 043 opened on the color resist for red color. Accordingly, slight brightness difference between the green light-emitting unit and the red light-emitting unit may be balanced.

It is understandable that the color resist for first color 042B, the color resist for second color 042G, and the color resist for third color 042R as described above are not limited to the color resist units at edges of the display area, but also include the color resist units at the center region of the display area. Accordingly, brightness ratios of the light-emitting elements of different colors may be adjusted as a whole, brightness uniformity of the entire display panel may be further improved, and display effects may thus be improved.

In one embodiment, with continuous reference to FIG. 15, the color filter layer 04 also includes a black matrix 044. The black matrix 044 is located between adjacent color resist units. Widths of the black matrices 044 in a first direction X in the climbing section gradually decrease. The first direction X is a direction from the display area AA to the edge of the display panel 00. By reducing the width of the black matrix 044 in the first direction X to increase the width of the color filter opening in the first direction, the area of the color filter opening may be further increased, and thus the brightness of the edge of the display area may be improved.

In one embodiment, in the display area, the encapsulation layer includes a climbing section. In the climbing section, the encapsulation layer includes at least one thickness variation. At least in the climbing section, a surface of the black matrix away from the substrate is a first surface. The first surface is recessed toward the substrate, forming a groove. At least one color resist unit adjacent to the black matrix is partially located in the groove.

Figure 16:
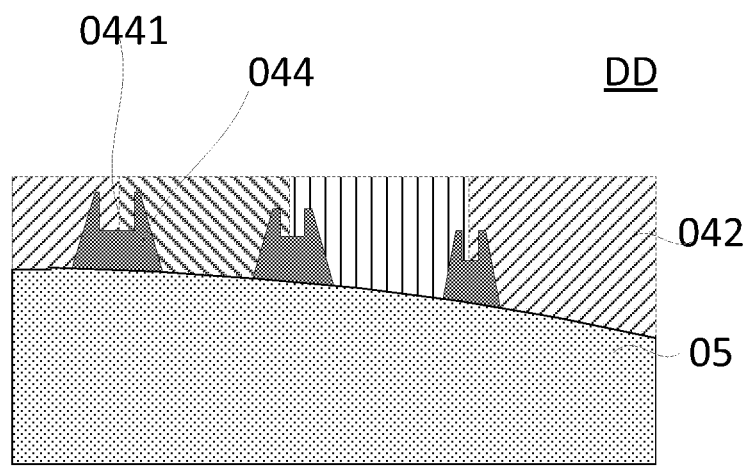
FIG. 16 illustrates a partially enlarged schematic diagram at area DD of a display panel shown in FIG. 15, consistent with the disclosed embodiments of the present disclosure.

FIG. 16 illustrates a partially enlarged schematic diagram at area DD of a display panel shown in FIG. 15. As shown in FIG. 16, in the display area AA, the encapsulation layer 05 includes a climbing section. In the climbing section, the thickness of the encapsulation layer 05 varies, including at least one variation. At least in the climbing section, a surface of the black matrix 044 away from the substrate 01 is a first surface. The first surface is recessed toward the substrate 01, forming a groove 0441. At least one color resist unit 042 adjacent to the black matrix 044 is partially located in the groove. At an edge of the color resist unit 042, part of the color resist unit 042 is located in the groove 0441 of the black matrix 044. The groove 0441 may accommodate part of the flowing color resist unit material when the color resist unit 042 is coated. Accordingly, uneven "horn" phenomena on contact edges between the color resist unit 042 and the black matrix 044 may be alleviated.

Figure 17:
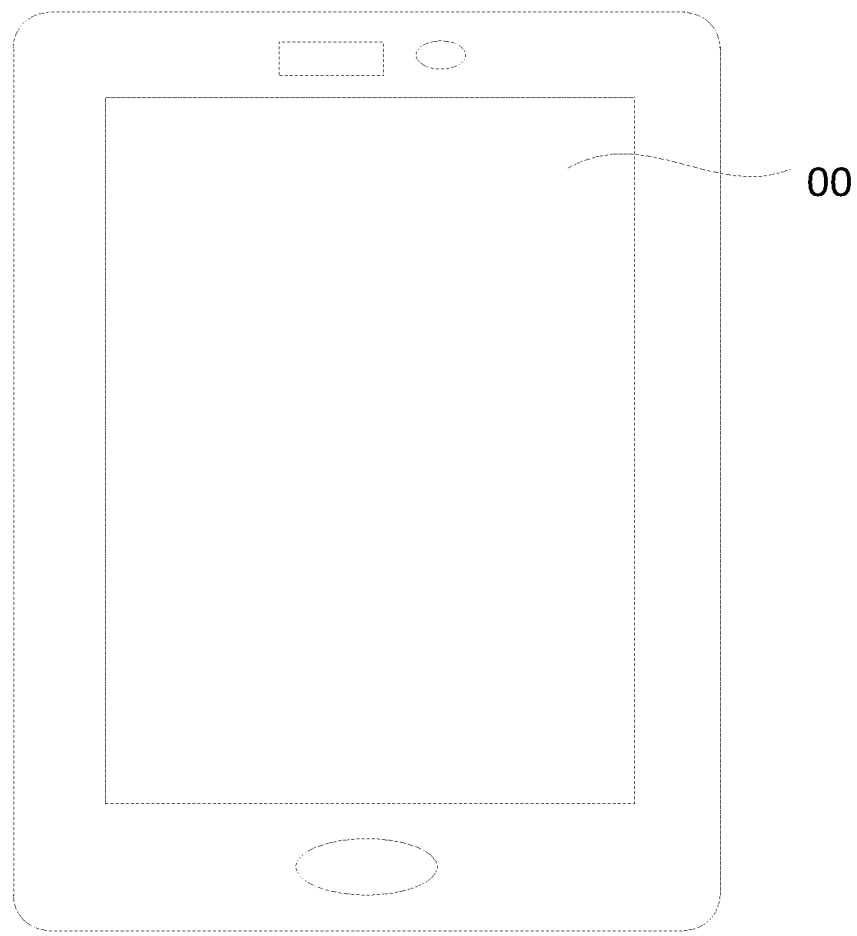
FIG. 17 illustrates a schematic diagram of a display device consistent with the disclosed embodiments of the present disclosure.

The present disclosure also provides a display device. FIG. 17 illustrates a schematic diagram of a display device consistent with the disclosed embodiments of the present disclosure. As shown in FIG. 17, the display device 000 includes a display panel 00 provided the present disclosure. The display device provided by the present disclosure includes, but is not limited to, following categories: television, notebook computer, desktop display, tablet computer, digital camera, mobile phone, smart bracelet, smart glasses, car monitor, medical equipment, industrial control equipment, touch interactive terminal, etc.

As disclosed, the technical solutions of the present disclosure have the following advantages.

The display panel provided by the present invention includes a substrate and a light-emitting layer. The light-emitting layer includes a plurality of light-emitting elements arranged in an array. The display panel also includes a color filter layer. The color filter layer is located on a side of the light-emitting layer away from the substrate. The color filter layer includes color filter openings arranged in one-to-one correspondence with the light-emitting elements. On one hand, by replacing a conventional polarizer with a color filter layer, not only a thickness of the display panel may be reduced, but also a light transmittance rate may be increased and brightness of the entire display panel may be improved. On the other hand, in the display area, the color filter openings may include a first color filter opening and a second color filter opening. The first color filter opening is located between the second color filter opening and an edge of the display panel. An orthographic projection area of the first color filter opening on a substrate is larger than an orthographic projection area of the second color filter opening on the substrate. By setting the orthographic projection area of the first color filter opening on the substrate to be larger than the orthographic projection area of the second color filter opening on the substrate, the light transmittance rate of the light-emitting element corresponding to the first color filter opening in the color filter layer may be increased. By setting color filter openings with different sizes in the color filter layer to balance brightness difference between the edge of the display area and the center of the display area, brightness consistency of the display panel may be improved, and display uniformity may be improved.

What is claimed is:

1. A display panel, comprising:
a display area;
a substrate;
an array layer, located on a side of the substrate;
a light-emitting layer, located on a side of the array layer away from the substrate, wherein the light-emitting layer includes a plurality of light-emitting elements arranged in an array;
a color filter layer, located on a side of the light-emitting layer away from the substrate, wherein the color filter layer includes a plurality of color filter openings, and the plurality of color filter openings is arranged in one-to-one correspondence with the plurality of light-emitting elements; and
an encapsulation layer, located between the light-emitting layer and the color filter layer,
wherein:
in the display area, the plurality of color filter openings includes a first color filter opening and a second color filter opening;
the first color filter opening is located between the second color filter opening and an edge of the display panel;
an orthographic projection area of the first color filter opening on the substrate is larger than an orthographic projection area of the second color filter opening on the substrate; and
a thickness of the encapsulation layer corresponding to the first color filter opening is smaller than a thickness of the encapsulation layer corresponding to the second color filter opening.

2. The display panel according to claim 1, wherein:
along a first direction, orthographic projection areas of at least part of the plurality of color filter openings on the substrate gradually increase; and
the first direction is a direction from the display area to the edge of the display panel.

3. The display panel according to claim 2, wherein:
along the first direction, the orthographic projection areas of the at least part of the plurality of color filter openings on the substrate change with a substantially equal difference.

4. The display panel according to claim 1, wherein:
the plurality of color filter openings further includes a third color filter opening;
the third color filter opening is located on a side of the second color filter opening away from the first color filter opening; and
an orthographic projection area of the third color filter opening on the substrate is smaller than or substantially equal to the orthographic projection area of the second color filter opening on the substrate.

5. The display panel according to claim 1, wherein:
the color filter layer further includes a plurality of color resist units arranged in one-to-one correspondence with the plurality of light-emitting elements; and
the plurality of color resist units includes a first color resist at least located at the first color filter opening, and a second color resist at least located at the second color filter opening.

6. The display panel according to claim 5, wherein:
a thickness of the first color resist is $H_1$, an orthographic projection area of the first color filter opening on the substrate is $S_1$, and a transmittance rate of the first color resist is Tr, wherein $$Tr \propto \frac{1}{H_1};$$

and
brightness of light of a light-emitting element of the plurality of light-emitting elements through the first color resist is L, wherein L=k*$S_1$*Tr, L∝$S_1$, k is a proportional coefficient, and k is related to light-emitting efficiency of the light-emitting element.

7. The display panel according to claim 6, wherein:
a thickness of the second color resist is Hz; and
an orthographic projection area of the second color filter opening on the substrate is $S_2$,
wherein:

$$H_1 > H_2;$$
$$S_1 > S_2; \text{ and}$$
$$\frac{S1}{S2} \propto \frac{1}{(H_1 - H_2)}.$$

8. The display panel according to claim 7, wherein:

$(S_1-S_2)/S_1 \leq 10\%$.

9. The display panel according to claim 5, wherein:
in the display area, the encapsulation layer includes a climbing section, wherein, along a first direction, a thickness of the climbing section in a second direction gradually decreases, and the second direction is a direction perpendicular to the substrate and pointing from the substrate to a light-exiting surface of the display panel;
the climbing section includes a first sub-zone and a second sub-zone, wherein the first sub-zone is located on a side of the second sub-zone close to the edge of the display panel;
a width of the first sub-zone in the first direction is $M_1$, a height of the first sub-zone in the second direction is $d_1$, and tan $$\varepsilon_1 = \frac{d_1}{M_1},$$

wherein $\alpha_1$ is a slope angle of the climbing section in the first sub-zone;
a width of the second sub-zone in the first direction is $M_2$, a height of the second sub-zone in the second direction is $d_2$, and tan $$\varepsilon_2 = \frac{d_2}{M_2},$$

where $\alpha_2$ is the slope angle of the climbing section in the second sub-zone Z2, and $\alpha_1 < \alpha_2$; and
in the first sub-zone, difference in the orthographic projection areas of adjacent color filter openings on the substrate is $\Delta S_1$, and in the second sub-zone, difference in the orthographic projection areas of adjacent color filter openings on the substrate is $\Delta S_2$, wherein $\Delta S_2 > \Delta S_1$.

10. The display panel according to claim 5, wherein:
the first color resist includes at least one first opening; and
an orthographic projection area of the at least one first opening on the substrate is smaller than the orthographic projection area of the first color resist on the substrate.

11. The display panel according to claim 10, wherein:
a geometric center of an orthographic projection of the light-emitting element corresponding to the first color filter opening on the substrate overlaps a geometric center of the orthographic projection of the first opening on the substrate.

12. The display panel according to claim 11, wherein:
the first color resist includes of a plurality of first openings;
the plurality of first openings is located on a side of the first color resist away from the geometric center of the first color resist; and
distances between each of the plurality of first openings located on the side of the first color resist away from the geometric center of the first color resist and the geometric center of the first color resist are substantially equal.

13. The display panel according to claim 10, wherein:
the second color resist includes at least one second opening;
an orthographic projection area of the at least one second opening on the substrate is smaller than an orthographic projection area of the second color resist on the substrate; and
a sum of the orthographic projection areas of each second opening on the substrate is smaller than a sum of the orthographic projection areas of each first opening on the substrate.

14. The display panel according to claim 10, wherein:
the color filter layer further includes a black matrix;
the black matrix is located between adjacent color resist units of the plurality of color resist units; and
the first opening is arranged around the black matrix.

15. The display panel according to claim 5, wherein:
the display panel further includes a non-display area, and the non-display area at least partially surrounds the display area;
in the display area, the encapsulation layer includes a climbing section, and in the climbing section, the encapsulation layer includes at least one thickness variation; and
the climbing section is located in a region of the encapsulation layer defined by translating a boundary between the display area and the non-display area toward the display area for a preset distance, wherein the preset distance is in a range of approximately 0-3 mm.

16. The display panel according to claim 5, wherein:
the first color resist includes a color resist for a first color, a color resist for a second color and a color resist for a third color, wherein a wavelength of light emitted by the light-emitting element corresponding to the color resist for the first color is a first wavelength, a wavelength of light emitted by the light-emitting element corresponding to the color resist for the second color is a second wavelength, and a wavelength of light emitted by the light-emitting element corresponding to the color resist for the third color is a third wavelength $\lambda 3$, wherein $\lambda 1 < \lambda 2 < \lambda 3$;
an orthographic projection area of the first color filter opening corresponding to the color resist for the first color on the substrate is larger than an orthographic projection area of the first color filter opening corresponding to the color resist for the second color on the substrate; and
the orthographic projection area of the first color filter opening corresponding to the color resist for the first color on the substrate is larger than an orthographic projection area of the first color filter opening corresponding to the color resist for the third color on the substrate.

17. The display panel according to claim 16, wherein:
the color resist for the first color is a blue color resist; and
an orthographic projection area of the first color filter opening corresponding to the color resist for the second color on the substrate is smaller than or substantially equal to the orthographic projection area of the first color filter opening corresponding to the color resist for the third color on the substrate.

18. The display panel according to claim 5, wherein:
the color filter layer further includes a black matrix, and the black matrix is located between adjacent color resist units; and
widths of the black matrices in a first direction in the climbing section gradually decrease along the first direction, wherein the first direction is a direction from the display area to the edge of the display panel.

19. The display panel according to claim 18, wherein:
in the display area, the encapsulation layer includes a climbing section, and in the climbing section, the encapsulation layer includes at least one thickness variation; and
at least in the climbing section, a surface of the black matrix facing away from the substrate is a first surface, wherein the first surface is recessed toward the substrate, forming a groove, and at least one color resist unit adjacent to the black matrix is partially located in the groove.

20. A display device, comprising a display panel, wherein the display panel comprises:
a display area;
a substrate;
an array layer, located on a side of the substrate;
a light-emitting layer, located on a side of the array layer away from the substrate, wherein the light-emitting layer includes a plurality of light-emitting elements arranged in an array;
a color filter layer, located on a side of the light-emitting layer away from the substrate, wherein the color filter layer includes a plurality of color filter openings, and the plurality of color filter openings is arranged in one-to-one correspondence with the plurality of light-emitting elements; and
an encapsulation layer, located between the light-emitting layer and the color filter layer,
wherein:
in the display area, the plurality of color filter openings includes a first color filter opening and a second color filter opening;
the first color filter opening is located between the second color filter opening and an edge of the display panel;
an orthographic projection area of the first color filter opening on the substrate is larger than an orthographic projection area of the second color filter opening on the substrate; and
a thickness of the encapsulation layer corresponding to the first color filter opening is smaller than a thickness of the encapsulation layer corresponding to the second color filter opening.

* * * * *